(12) United States Patent  
Sato et al.

(10) Patent No.: US 6,911,396 B2  
(45) Date of Patent: Jun. 28, 2005

(54) METHOD OF PRODUCING METALLIC FILM

(75) Inventors: Shuzo Sato, Kanagawa (JP); Takeshi Nogami, Kanagawa (JP); Yuji Segawa, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/469,580

(22) PCT Filed: Dec. 27, 2002

(86) PCT No.: PCT/JP02/13837

§ 371 (c)(1),
(2), (4) Date: Sep. 2, 2003

(87) PCT Pub. No.: WO03/058696

PCT Pub. Date: Jul. 17, 2003

(65) Prior Publication Data

US 2004/0097070 A1 May 20, 2004

(30) Foreign Application Priority Data

Jan. 7, 2002 (JP) .............................................. 2002-422

(51) Int. Cl.⁷ ..................... H01L 21/311; H01L 21/461; H01L 21/20
(52) U.S. Cl. ..................... 438/692; 438/697; 438/584
(58) Field of Search ................................. 438/584, 692, 438/697, 758; 205/170–171, 175, 182, 219–220, 223

(56) References Cited

U.S. PATENT DOCUMENTS

| | | | | |
|---|---|---|---|---|
| 4,097,342 A | * | 6/1978 | Cooke et al. ................ | 205/139 |
| 5,567,300 A | * | 10/1996 | Datta et al. .................. | 205/652 |
| 6,056,864 A | * | 5/2000 | Cheung ........................ | 205/222 |
| 6,103,086 A | * | 8/2000 | Woo et al. .................... | 205/164 |
| 6,333,120 B1 | * | 12/2001 | DeHaven et al. ............ | 428/615 |
| 6,344,129 B1 | * | 2/2002 | Rodbell et al. .............. | 205/291 |
| 6,495,443 B1 | * | 12/2002 | Lopatin et al. .............. | 438/618 |
| 6,572,753 B2 | * | 6/2003 | Chalyt et al. ................. | 205/81 |
| 6,572,982 B1 | * | 6/2003 | Uzoh et al. .................. | 428/675 |
| 6,776,893 B1 | * | 8/2004 | Too et al. .................... | 205/123 |

FOREIGN PATENT DOCUMENTS

| | | |
|---|---|---|
| JP | 2000-64083 A1 | 2/2000 |
| JP | 2002-121698 A1 | 4/2002 |
| JP | 2002-222776 A1 | 8/2002 |

OTHER PUBLICATIONS

International Search Report.
Preliminary Examination Search Report.

* cited by examiner

*Primary Examiner*—Matthew Smith
*Assistant Examiner*—Chuong Anh Luu
(74) *Attorney, Agent, or Firm*—Rader, Fishman & Grauer PLLC; Ronald P. Kananen

(57) ABSTRACT

Concentration of electric current due to an additive (particularly, a brightener) remaining or precipitated in a high concentration at grain boundary triple points and wiring groove portions in the surface layer of a copper plating film is obviated, whereby precedent dissolution and/or abnormal dissolution due to concentration of electric current is restrained, and an electropolished surface of the copper plating film with excellent surface smoothness is obtained.

A method of producing a metallic film includes the steps of: forming a metallic plating film (copper plating film (15)) by use of a plating solution prepared by adding a plating additive for restraining void generation, bottom-up fill and overfill; and electropolishing the metallic plating film by use of an electropolishing solution prepared by adding a polishing additive capable of reacting or coupling with the plating additive component contained or precipitated in the surface layer of the metallic plating film.

7 Claims, 4 Drawing Sheets

METHOD OF PRODUCING METALLIC FILM

TECHNICAL FIELD

The present invention relates to a method of producing a metallic film, and particularly to a method of producing a metallic film in which formation of a plating film is followed by electropolishing so as to planarize the ruggedness of the plating film.

BACKGROUND ART

Attendant on the advance of plating technology, various additives have come to be added to the electrolytic solution at the time of plating for the purposes of the so-called voidless filling to restrain formation of voids in connection holes or grooves, filling up the connection holes and grooves from the bottom portions thereof (bottom-up fill), or restraining overfill, in the process of such plating as to fill up the connection holes and grooves as desired.

The additive components added to the electrolytic solution are taken into the copper film formed, and the electrolysis conditions vary at crystal grain boundaries where the concentration of the additive for promoting or restraining electrolysis is higher, making it difficult to achieve uniform electrolytic removal. Therefore, it has been difficult to uniformly form a buried wiring.

As a result, there have been the problems that local non-uniformity is generated due to the remaining of copper as the wiring material after polishing or due to over-polishing, which will lead to the generation of shortcircuit or opening of the wiring; that an unstable surface with a high surface roughness is generated; that a deficiency in the sectional area of the wiring arises from the recession of the wiring portion due to over-polishing; that a deficiency is generated in the in-plane uniformity owing to dishing; that corrosion is generated; and so on.

As for the formation of a copper film by electroplating, semiconductor makers have put their energy into development of copper plating technology since IBM announced the copper wiring technology in September, 1997. In the first stage of plating, it has been the problem to fill up connection holes and grooves in a voidless manner. Bottom-up filling is important for realizing the voidless filling, and it is said that this problem has been solved to a certain degree by control of additives. For realizing the bottom-up fill (filling up of the grooves and connection holes from the bottom portions thereof), it has been developed to use two components, i.e. a carrier and a brightener, as additives.

The carrier, basically, is a polymer having a low electric conductivity and restraining electric current so as to restrain the plating action, and has a such property that it will not easily enter into the bottom portions of the grooves and connection holes but will remain on the wafer surface. Examples of the carrier include polyethylene glycol (PGA). If the carrier is not contained in the plating solution, the plating film would be built up on the wafer surface to a height equivalent to the bottom portions of the grooves and connection holes.

The brightener, fundamentally, is ionized to enhance electric conductivity, thereby increasing the electric current and promoting the plating action. The brightener enters into the bottom portions of the grooves and connection holes, dwells in the bottom portions and constantly moves to the surface layer of copper being precipitated, thereby effecting the bottom-up fill. Even after the filling of the grooves and connection holes is completed, the concentration of the brightener is high at the areas of the grooves and connection holes, so that the precipitation of copper is faster in the areas than the other areas, resulting in the formation of swells called humps (or bumps), namely, overfill. As the brightener, there are used, for example, sulfur compounds such as MPSA (mercaptothiazole) and ammonium pyrrolidinedithiocarbamate, azo dyes, etc.

In the second stage of plating, although the voidless filling is made possible by use of the above-mentioned additives, there is the problem of overfill which would be generated under the bottom-up effect. In view of this, a three-component additive system obtained by adding the following additive to the above-mentioned two additives has come to be used.

For example, a leveler is added. Where the carrier-brightener two-component system is used, the carrier cannot suppress the promotion effect of the brightener entering into the connection holes and grooves, and, as a result, overfill occurs. The leveler, basically, has the same plating-restraining function as that of the carrier, and is deposited on the opening portions of the connection holes and grooves where the potential is concentrated. Therefore, while-preventing the formation of overhangs, the leveler traps the bottom-up fill due to the brightener at the opening portions of the connection holes and grooves, and, eventually, restrains the overfill.

However, of the additives taken into the copper film filling up the connection holes and grooves, the brightener having entered into the bottoms of via holes and having contributed to promotion of plating is left and precipitated at grain boundaries in the process of crystal growth after the bottom-up fill by crystal growth; the concentration of the brightener is higher particularly at the portions which have been grain boundary triple points or wiring grooves (depressions). For example, as shown in (a) of FIG. 4, in the case of a copper plating film 33 formed by electroplating to fill up a groove 32 formed in an insulating film 31, plating additives 41 (particularly, the brightener) will remain in a high concentration at the copper plating film portion at the groove 32. When the copper plating film 33 is then subjected to ordinary electropolishing, electric current is concentrated on the portion where the plating additives 41 remain in a high concentration, whereby the portion is dissolved selectively and precedingly, to generate a pit 51, for example, in the copper plating film 33, as shown in (b) of FIG. 4. As a result, the surface smoothness is insufficient, and it is therefore difficult to form a desired buried wiring. Though not shown, the plating additives (particularly, the brightener) would easily be concentrated also at the grain boundaries in the copper plating film, so that pits would be generated there through preceding dissolution or abnormal dissolution at the time of electropolishing, resulting in that the electropolished surface is rugged.

DISCLOSURE OF INVENTION

In accordance with the present invention, there is provided a method of producing a metallic film which includes the steps of: forming a metallic plating film by use of a plating solution prepared by adding a plating additive for restraining void generation, bottom-up fill and overfill; and electropolishing the metallic plating film by use of an electropolishing solution prepared by adding a polishing additive capable of reacting and coupling with the plating additive component contained or precipitated in a surface layer of the metallic plating film.

In the above-mentioned method of producing a metallic film, the plating additive having the purpose of restraining void generation, bottom-up fill and overfill is added to the plating solution. Therefore, though the plating additive component particularly tends to be contained or precipitated in a high concentration at grain boundaries and wiring portions in the surface layer of the plating film thus formed, the addition of the polishing additive capable of preferentially reacting or coupling with the plating additive component ensures that the polishing additive covers selectively the grain boundary portions, and restrains or cuts off the electrolytic current, thereby partially protecting or restraining those portions from electrolytic dissolution. Therefore, precedent dissolution due to local current concentration is restrained, and the electrolyzed surface is restrained from becoming a rugged surface due to pit formation through precedent dissolution or abnormal dissolution at the grain boundaries or wiring portions, so that a polished surface with excellent surface smoothness is obtained.

In the method of producing a metallic film according to the present invention, after the plating step and before the electropolishing step, a pretreatment step is conducted for protecting the grain boundaries generated in the surface of the metallic plating film by use of an electrolytic solution prepared by adding a polishing additive capable of reacting or coupling with the plating additive component contained or precipitated in the surface layer of the metallic plating film.

Thus, after the plating step and before the electropolishing step, the grain boundaries generated in the surface of the metallic plating film are protected by use of the electrolytic solution prepared by adding the polishing additive capable of reacting or coupling with the plating additive component contained or precipitated in the surface layer of the metallic plating film. Therefore, since the grain boundary portions are selectively covered with the polishing additive having reacted or coupled with the plating additive component, the electrolytic current at these portions is suppressed or cut off, whereby partial protection or restraint from electrolytic dissolution is achieved. Accordingly, upon electropolishing after the pretreatment step, the protection of the grain boundary portions in the surface of the metallic plating film ensures that abnormal dissolution and precedent dissolution at these portions are prevented, and a smooth electropolished surface can be obtained.

After the plating step and before the electropolishing step, a step of forming a new metallic plating film on the surface of the metallic plating film is conducted by isotropic plating using an electrolytic solution which does not contain the above-mentioned plating additive but promises isotropic plating.

Since the new metallic plating film is thus formed by isotropic metallic plating, the plating additive component contained or precipitated in a high concentration, particularly at the grain boundary portions or the like, in the metallic plating film formed by the plating treatment using the electrolytic solution prepared by adding the plating additive for restraining void generation, bottom-up fill and overfill is dispersed isotropically and uniformly into the metallic plating film newly formed by the isotropic metallic plating. Therefore, upon electropolishing of this metallic plating film, local excessive electropolishing is restrained, and uniform electropolishing is realized. As a result, a smooth electropolished surface can be obtained.

According to the method of producing a metallic film of the present invention, since the metallic plating film is electropolished by use of the electropolishing solution prepared by adding the polishing additive capable of preferentially reacting or coupling with the plating additive component (particularly, a brightener), even if the plating additive (particularly, the brightener) is remaining or precipitated in a high concentration in the surface of the metallic plating film, the portions rich in the plating additive can be covered with the polishing additive, whereby the electrolytic current at these portions can be suppressed or cut off. As a result, precedent dissolution and/or abnormal dissolution due to local current concentration can be restrained, so that an electropolished surface with excellent surface smoothness can be obtained.

BEST MODE FOR CARRYING OUT THE INVENTION

Figure 1:
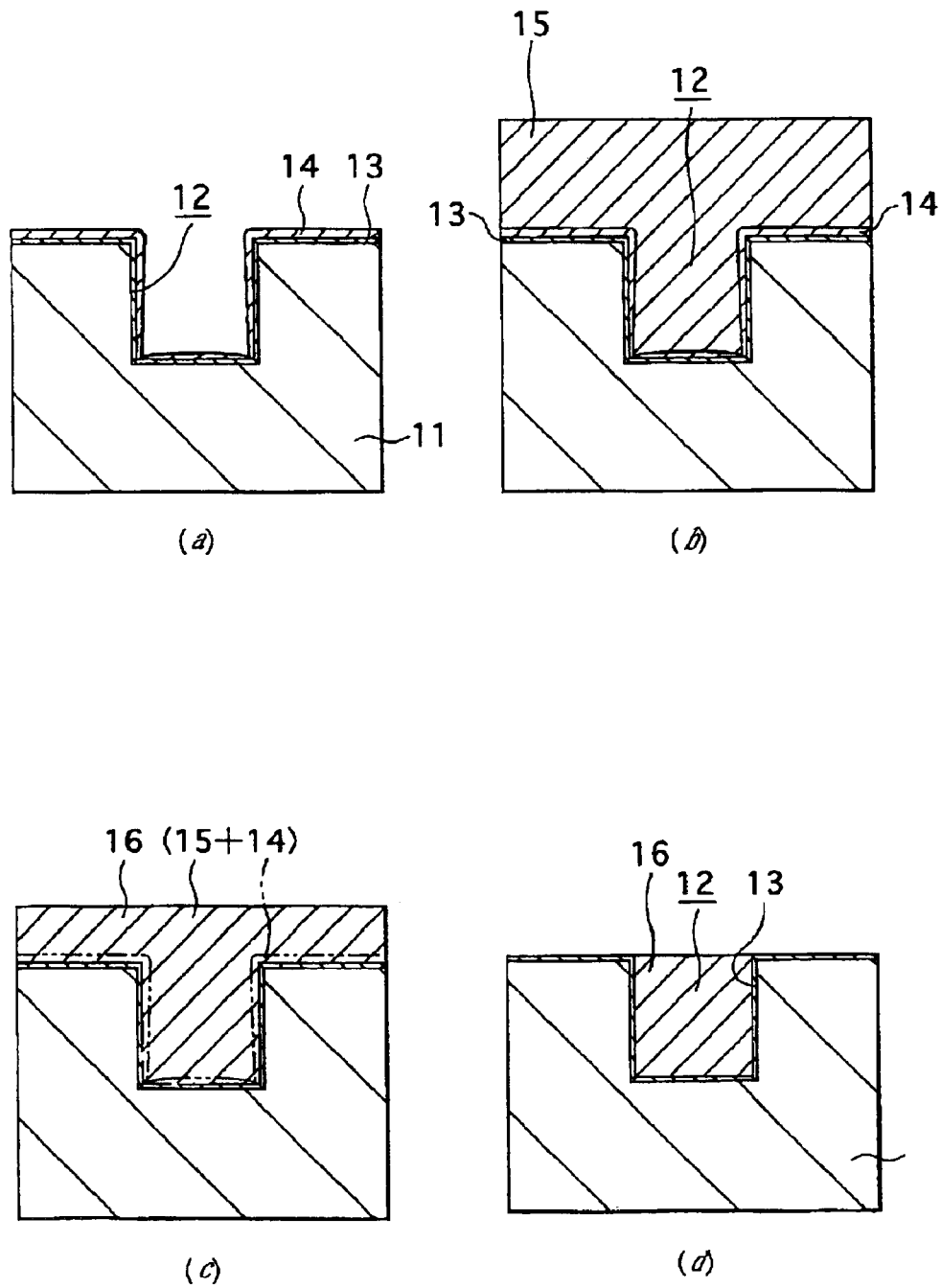
FIG. 1, consisting of FIGS. 1A, 1B, 1C and 1D, shows general constitutional sectional views for illustrating a first embodiment of the method of producing a metallic film according to the present invention.

A first embodiment of the method of producing a metallic film according to the present invention will be described referring to the general constitutional sectional views in FIG. 1. In FIG. 1, the plating step for a metallic plating film (copper plating film) in the step of forming a groove wiring used in a semiconductor device and the electropolishing step for the copper plating film thus formed are shown, as an example.

As shown in (a) of FIG. 1, an insulating film 11 is formed on a substrate (not shown), and a wiring groove 12 is formed in the insulating film 11. Generally, in the formation of a groove wiring, a barrier layer 13 is formed on the inside surfaces of the wiring groove 12, and a close contact layer (copper shield layer) 14 is formed on the surface of the barrier layer 13. The barrier layer 13 is composed, for example, of a tantalum nitride film formed by sputtering. The close contact layer 14 is composed, for example, of a copper film formed by sputtering. Copper plating is conducted by electroplating, so as to fill up the inside of the wiring groove 12 with such a constitution.

The copper plating is conducted by use of a plating solution prepared by adding a plating additive for restraining void generation, bottom-up fill and overfill. As a result, as shown in (b) of FIG. 1, a copper plating film 15 as a metallic plating film is formed on the insulating film 11 with the barrier layer 13 and the close contact layer 14 therebetween, so as to fill up the wiring groove 12.

Next, as shown in (c) of FIG. 1, the copper film 16 (the copper plating film 15 and the close contact layer 14) is electropolished by use of an electropolishing solution. The electropolishing is conducted by use of the electropolishing solution which is prepared by adding a polishing additive capable of reacting or coupling with the above-mentioned plating additive component contained or precipitated in the surface layer of the copper plating film 15. Incidentally, (c) of FIG. 1 shows the condition in the course of electropolishing. As a result, as shown in (d) of FIG. 1, a constitution in which the wiring groove 12 is filled up with the copper film 16, with the barrier layer 13 therebetween, can be obtained. Thereafter, an excess of the barrier layer 13 on the insulating film 11 is removed by a known removing method (for example, chemical mechanical polishing, etching or the like).

A specific example of the electropolishing solution will be described below.

In an electrolytic solution constituting the base of the electropolishing solution, phosphoric acid, pyrophosphoric acid, ammonium phosphate, copper sulfate, ammonium sulfate, sulfuric acid and the like may be used as an electrolyte for passing an electric current.

As a conditioning agent for conditioning the copper ion concentration in the electrolytic solution, there may be used glycine, copper pyrophosphate, copper sulfate and the like.

As an agent for forming a water-soluble copper complex in the electrolytic solution, there may be used ethylenediamine, potassium pyrophosphate, cyanogens, and organic acids such as propionic acid, oxalic acid, acetic acid, etc.

As an agent for forming a copper passivation film in the electrolytic solution, there may be used quinaldic acid, anthranilic acid and the like.

As a pH regulator in the electrolytic solution, there may be used sodium hydroxide, potassium hydroxide, aqueous ammonia, sulfuric acid, phosphoric acid, and organic acids such as carboxylic acids, acetic acid, oxalic acid, etc.

The electrolytic solution contains a surface active agent added thereto.

The electrolytic solution contains, added thereto, a polishing additive capable of reacting or coupling with the above-mentioned plating additive component contained or precipitated in the surface layer of the copper plating film 15, according to the characteristic feature of the present invention. As the polishing additive, there may be used a mercaptothiazole compound having an NCSS structure, organic acids and the like.

Furthermore, the electrolytic solution contains, added thereto, a benzene ring-containing compound, a polymeric organic matter or the like as a source of insulating groups for lowering the electric conductivity in the regions of action of the polishing additive capable of reacting or coupling with the plating additive component.

In the above-mentioned method, the copper plating film 15 is formed, upon plating, by use of the plating solution prepared by adding the plating additive for the purpose of restraining void generation, bottom-up fill and overfill. Therefore, after the formation of the copper plating film 15, the plating additive component, mainly the brightener, is present in the state of being contained or precipitated in a high concentration at the grain boundaries in the surface layer or at the wiring portion formed in the wiring groove 12. The brightener may be, for example, a sulfur-containing organic compound.

The electropolishing of the copper film 16 is conducted by use of the electropolishing solution prepared by adding the polishing additive capable of reacting or coupling with the plating additive component thus left. Therefore, by preferentially reacting or coupling with the plating additive (particularly, the brightener), the polishing additive covers the grain boundary portions selectively, and restrains or cuts off the electrolytic current, whereby the portions susceptible to electrolytic dissolution are protected, generation of pits due to local electrolytic dissolution at the grain boundary portions is restrained, and a smooth finished surface can be obtained.

Next, the mechanism of the electropolishing will be described, referring to FIG. 2.

Figure 2:
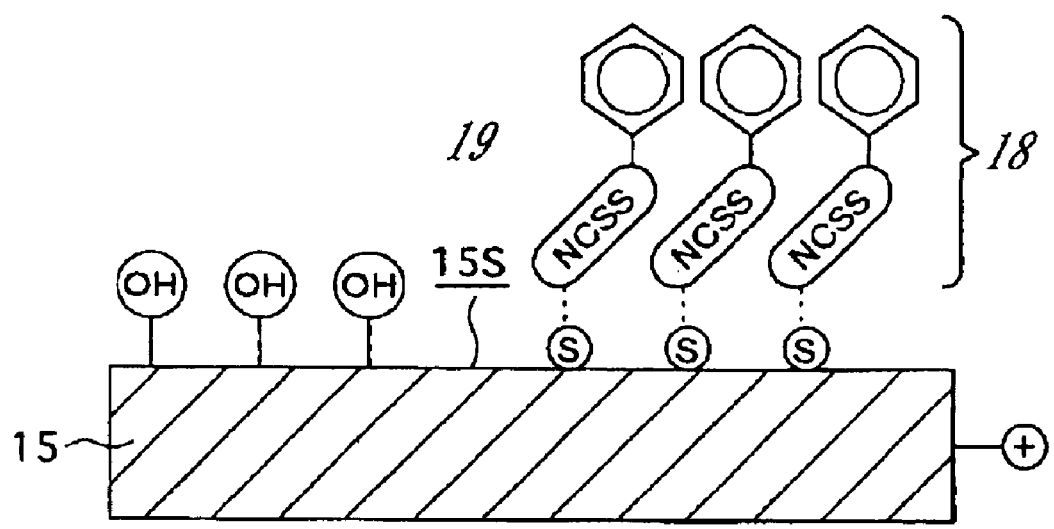
FIG. 2 illustrates the mechanism of electropolishing in the method of producing a metallic film according to the present invention.

As shown in FIG. 2, at the time of electropolishing the copper plating film 15, the side of the copper plating film 15 is set to be the positive electrode. In this case, of the metallic bond surface of the copper plating film 15, the surface 15S in contact with the electrolytic solution 19 is a hydroxide surface hydrogen-bonded to —OH groups (hydroxyl groups). In addition, an organic compound S (principally, the plating additive; particularly, the brightener), for example, a sulfur-containing organic compound, distributed or precipitated at the grain boundaries is, in this condition, higher in electric (ionic) conductivity than the hydroxide surface to which the —OH groups are bonded. Therefore, when a voltage is uniformly applied to the copper plating film 15, the electric current is concentrated on the grain boundary portions, and these portions undergo the electrolyzing action selectively and preferentially.

On the other hand, where the polishing additive 18 (for example, a mercaptothiazole compound having the NCSS structure) has reacted or coupled with the organic compound S, the organic compound S makes contact with the electropolishing solution via the surface of the substance with a lower electric (ionic) conductivity, such as the benzene ring, bonded to the polishing additive 18, so that the portions in this condition are lower in electric conductivity than the condition of the hydroxide to which the —OH groups are bonded. Therefore, the electric current is dispersed to the most hydroxide surface other than the portions (grain boundaries, etc.) where the plating additive is concentrated. As a result, selective dissolution at the portions (grain boundaries, etc.) where the plating additive is concentrated would not occur, and the electrolytic dissolution action occurs starting from the crystal surface other than the portions (grain boundaries, etc.) where most of the plating additive is concentrated. Accordingly, ruggedness such as pits is not generated in the surface under polishing, and the surface under polishing can be planarized by electrolytic dissolution.

Next, a second embodiment of the method of producing a metallic film according to the present invention will be described below.

In the method described above referring to FIG. 1, a pretreatment step by use of a pretreating agent for protecting the grain boundaries in the copper film is conducted after the plating step for forming the copper film by electroplating and after the polishing step for electropolishing the copper film. As the pretreating agent in the pretreatment step, there may be used a solution prepared by adding as an additive a substance which does not have an etching action on the copper metallic surface and which has a reactional group for preferential reaction with the organic compound or plating promoter added at the time of plating and an insulating group for hindering passage of electric current. For example, the electropolishing solution which has been described in the first embodiment may be used. In the electropolishing solution, the above-mentioned polishing additive is the substance having the reactional group, while the benzene ring-containing compound or polymeric organic matter is the substance having the insulating group.

In the pretreatment, the electrolytic solution prepared by adding the polishing additive is used, and, before the electropolishing, the surface of the copper plating film is kept in contact with the electropolishing solution for a predetermined period of time without impressing a voltage on the copper plating film, whereby the pretreatment can be realized.

As a result, the organic matter, the plating promoter and the like precipitated in high concentrations at the grain boundary portions of the surface of the copper plating film and at the copper plating film portion in the wiring groove react with the reactional groups, and the reaction products are selectively deposited on these portions to worsen the electric conductivity there, whereby selective dissolution due to concentration of electric current and precedent dissolution or abnormal dissolution at the grain boundary portions at the time of electrolysis of the copper plating film surface by passage of electric current are prevented, and a smooth electrolyzed surface is formed.

Next, a third embodiment of the method of producing a metallic film according to the present invention will be described, referring to general constitutional sectional views in FIG. 3.

Figure 3:
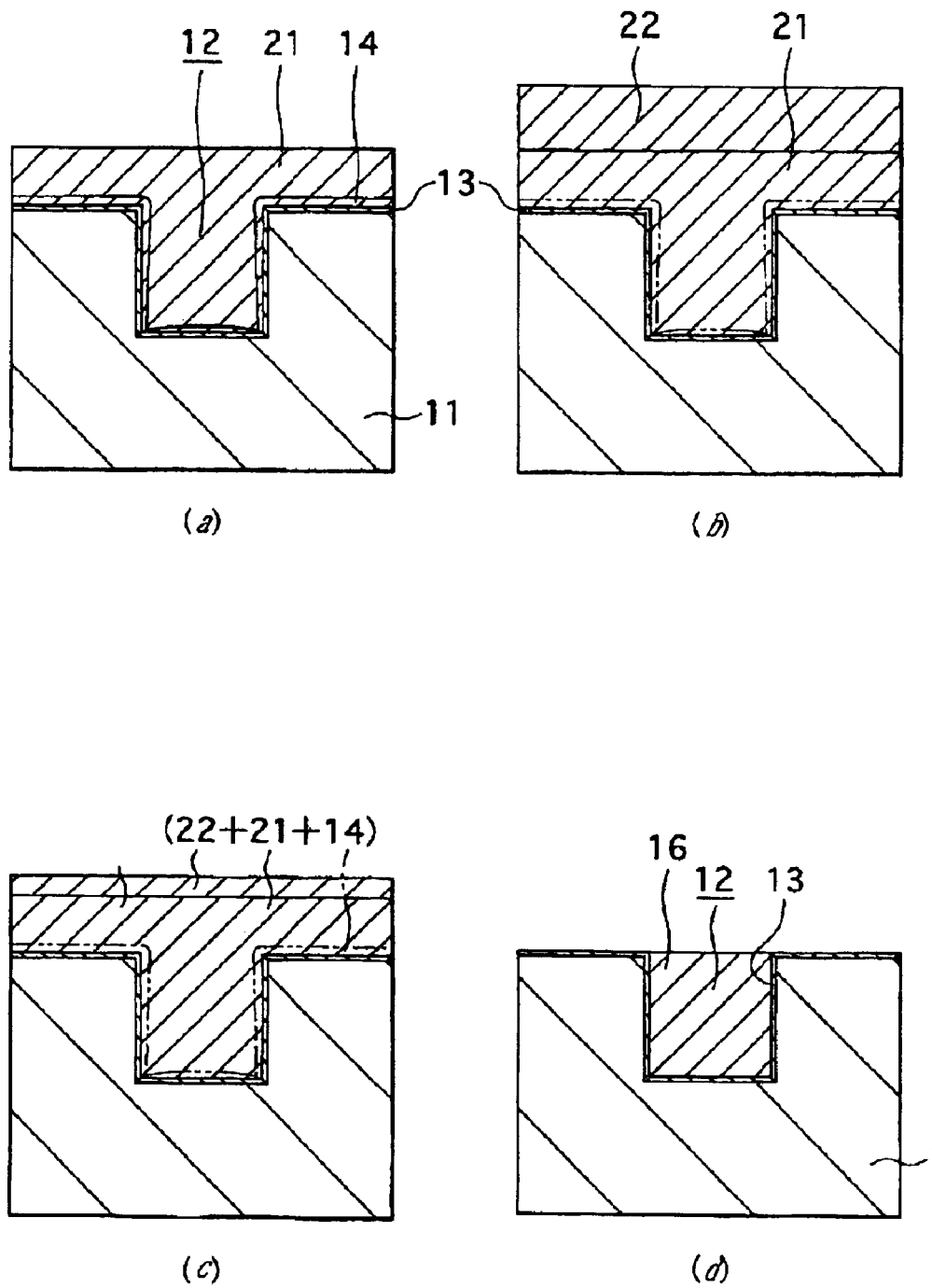
FIG. 3 consisting of FIGS. 3A, 3B, 3C, and 3D, shows general constitutional sectional views for illustrating a third embodiment of the method of producing a metallic film according to the present invention.
Figure 4:
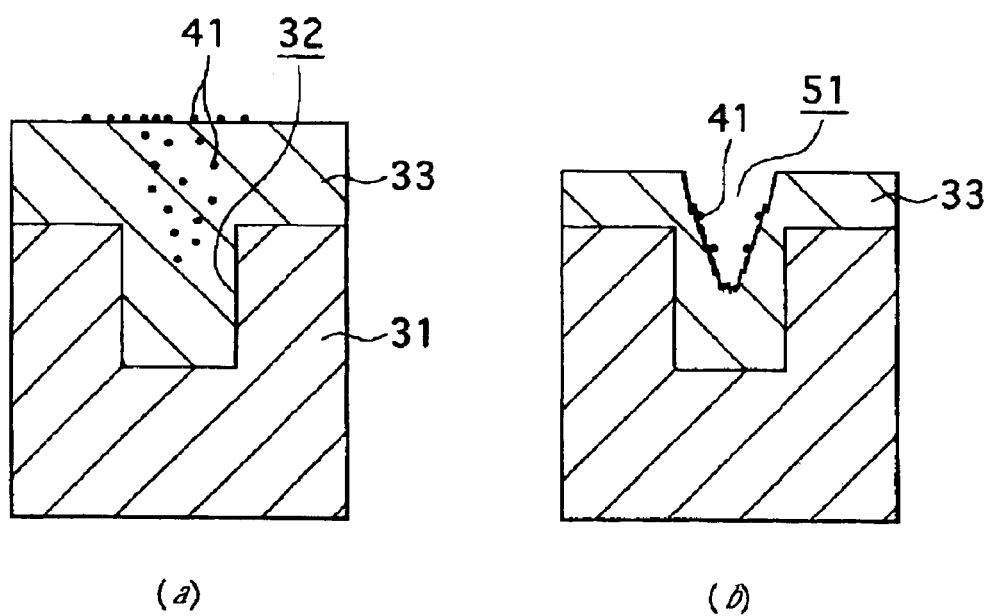
FIG. 4 consisting of FIGS. 4A and 4B, shows general constitutional section views for illustrating the problem to be solved.

As shown in (a) of FIG. 3, an insulating film 11 is formed on a substrate (not shown), and a wiring groove 12 is formed in the insulating film 11. Generally, in the formation of a groove wiring, a barrier layer 13 is formed on the inside surfaces of the wiring groove 12, and a close contact layer (copper shield layer) 14 is formed on the surface of the barrier layer 13. The barrier layer 13 is composed, for example, of a tantalum nitride film formed by sputtering. The close contact layer 14 is composed, for example, of a copper film formed by sputtering. Copper plating is conducted by electroplating, so as to fill up the inside of the wiring groove 12 with such a constitution.

The copper plating is conducted by use of a plating solution prepared by adding a plating additive for restraining void generation, bottom-up fill and overfill. As a result, a first copper plating film 21 as a metallic plating film is formed on the insulating film 11 with the barrier layer 13 and the close contact layer 14 therebetween, so as to fill up the wiring groove 12.

Subsequently, as shown in (b) of FIG. 3, a second copper plating film 22 is formed on the first copper plating film 21 by electroplating. The copper plating is conducted by an isotropic plating treatment using an electrolytic solution which does not contain the plating additive, particularly the additive for the purpose of bottom-up fill, described in the first embodiment above and which promises isotropic plating.

Next, as shown in (c) of FIG. 3, the copper film 16 (the second copper plating film 22, the first copper plating film 21 and the close contact layer 14) is electropolished. The electropolishing may be conducted by use of an ordinary electropolishing solution or may be conducted by use of the electropolishing solution prepared by adding the polishing additive used in the first embodiment above. Incidentally, (c) of FIG. 3 shows the condition in the course of electropolishing. As a result, as shown in (d) of FIG. 3, a constitution in which the wiring groove 12 is filled up with the copper film 16, with the barrier layer 13 therebetween, can be obtained. Thereafter, an excess of the barrier layer 13 on the insulating film 11 is removed by a known method (for example, chemical mechanical polishing, etching, or the like).

According to this producing method, the plating additive component for restraining void generation, bottom-up fill and overfill is contained or precipitated in a high concentration in the first copper plating film 21 formed by use of the plating solution prepared by adding the plating additive, particularly at grain boundary portions of the surface layer and in the wiring groove 12. However, since the second copper plating film 22 is formed on the first copper plating film 21 by the plating treatment using the electrolytic solution which does not contain the plating additive and which promises isotropic plating, the plating additive component contained or precipitated in a high concentration at the grain boundary portions and in the wiring groove 12 is dispersed isotropically and homogeneously into the outermost surface layer of the second copper plating film 22. Therefore, electropolishing of the second copper plating film 22, the first copper plating film 21 and the like can be conducted while preventing abnormal dissolution or precedent dissolution at the grain boundary portions and the groove wiring portion, so that it is possible to form a smooth electropolished surface free of generation of pits and steps at the grain boundary portions.

In the above description, the technology of forming a copper plating film in a wiring groove and thereafter performing electropolishing to form a wiring composed principally of the copper plating film in the wiring groove has been described as an example. However, the technology according to the present invention can be applied also to the case where a wiring groove and a connection hole are formed in place of the wiring groove or the case where only the connection hole is formed, and where a metallic plating film, for example, a copper plating film is formed so as to fill up the wiring groove and the connection hole and thereafter electropolishing is conducted to form a groove wiring and/or a plug. In addition, application of the technology according to the present invention is not limited to the application to the technology of forming a groove wiring in a semiconductor device but includes the application to the case where the formation of a metallic plating film is followed by electropolishing of the metallic film.

INDUSTRIAL APPLICABILITY

In the method of producing a metallic film according to the present invention, a metallic plating film is electropolished by use of an electropolishing solution prepared by adding a polishing additive capable of preferentially reacting or coupling with a plating additive component (particularly, a brightener). Therefore, even where the plating additive (particularly, the brightener) is left or precipitated in a high concentration in the surface layer of the metallic plating film, the portions where the plating additive is concentrated can be covered with the polishing additive, whereby the electrolytic current at these portions can be suppressed or cut off. Accordingly, precedent dissolution and/or abnormal dissolution due to local concentration of electric current can be restrained, so that an electropolished surface with excellent surface smoothness can be obtained.

What is claimed is:

1. A method of producing a metallic film comprising the steps of:

forming a metallic plating film by use of a plating solution with a plating additive for restraining void generation, bottom-up fill and overfill; and electropolishing said metallic plating film by use of an electropolishing solution with a polishing additive capable of reacting or coupling with said plating additive component contained or precipitated in a surface layer of said metallic plating film.

2. A method of producing a metallic film as set forth in claim 1, which comprises:

a pretreatment step for protecting grain boundaries generated in the surface of said metallic plating film, by use of an electrolytic solution with a polishing additive capable of reacting or coupling with said plating additive component contained or precipitated in said surface layer of said metallic plating film, after said plating step and before said electropolishing step.

3. A method of producing a metallic film as set forth in claim 1, comprising:

a step of forming a new metallic plating film on the surface of said metallic plating film, by an isotropic plating treatment using an electrolytic solution which does not contain said plating additive and which promises isotropic plating, after said plating step and before said electropolishing step.

4. A method of producing a metallic film as set forth in claim 1 where the plating additive is a brightener.

5. A method of producing a metallic film as set forth in claim 4 where the brightener is a sulfur-containing organic compound.

6. A method of producing a metallic film as set forth in claim 1 where the polishing additive is an organic acid.

7. A method of producing a metallic film as set forth in claim 6 where the organic acid is a mercaptothiazole compound having an NCSS structure.

* * * * *